United States Patent [19]
White et al.

[11] Patent Number: 5,006,854
[45] Date of Patent: Apr. 9, 1991

[54] METHOD AND APPARATUS FOR CONVERTING A/D NONLINEARITIES TO RANDOM NOISE

[75] Inventors: Bert White, Irvine; Mehrdad Negabahn-Hagh, both of Irvine, Calif.

[73] Assignee: Silicon Systems, Inc., Tustin, Calif.

[21] Appl. No.: 311,237

[22] Filed: Feb. 13, 1989

[51] Int. Cl.$^5$ .............................................. H03M 1/38
[52] U.S. Cl. .................................. 341/172; 341/164; 341/165
[58] Field of Search ............... 341/172, 167, 166, 161, 341/164, 165, 118

[56] References Cited
U.S. PATENT DOCUMENTS 4,399,426  8/1983  Tan ................................. 341/172 X
4,404,544  9/1983  Dwarakanath ................. 341/172 X Primary Examiner—A. D. Pellinen
Assistant Examiner—Sharon D. Logan
Attorney, Agent, or Firm—Hecker & Harriman

[57] ABSTRACT

A method and apparatus for removing the effects of mismatched components in an A/D converter is described. The present invention dynamically rearranges the capacitors of an A/D converter so that physical mismatch is averaged out. In the preferred embodiment of the present invention, an array of equally-sized capacitors is coupled to a switching network. A successive approximation scheme is implemented in which the input signal is coupled through SAR switches to the capacitor array. Each switch is coupled to $2^{N-1}$ capacitors where N is the switch number. For example, in an 8-bit scheme, there are 3 switches with switch 1 coupled to one capacitor, switch 2 coupled to two capacitors, and switch 3 coupled to four capacitors. In this manner, eight levels of capacitance values can be defined. The present invention adds a scramble control code to control the switching array so that the physical capacitors themselves are coupled to different SAR switches at different times. This requires a scramble matrix of switches, which in the present invention requires N×2N switches where N equals the number of bits of control code. In this manner, the effects of any variations in the capacitance ratios is averaged out and converted to noise which can be filtered out of the signal.

34 Claims, 3 Drawing Sheets

METHOD AND APPARATUS FOR CONVERTING A/D NONLINEARITIES TO RANDOM NOISE

BACKGROUND OF THE PRESENT INVENTION

1. Field of the Invention

This invention relates to the field of analog to digital converters.

2. Background Art

It is often desired to convert an analog signal to a digital signal. For converting electrical signals, an analog to digital (A/D) converter is used. There are several types of A/D converters used in the prior art.

One simple method of A/D conversion is known as a tracking converter in which an analog input signal is coupled to a comparator along with with output of a digital to analog (D/A) converter. The output of the comparator is coupled to an up/down counter and the output of the counter is coupled to the input of the D/A converter. When the analog input is higher than the output of the D/A converter, the counter counts up. When the analog input is lower than the D/A converter, the counter counts down. The output of the converter is stable when a change of one count up or down causes the comparator output to reverse sign.

Another type of prior art A/D converter is an integrating converter such as a dual slope integrator. An analog input signal is coupled to a three position switch, where one position is grounded and the remaining contact is connected to a stable reference voltage. The output of the switch is connected to an analog integrator with a time constant TL. The output of the integrator drives a comparator whose output is coupled to a control circuit. The control circuit is coupled to the input switch and switches the input from the analog input to ground and to the reference voltage VR. The control circuit is also coupled in a loop with a digital counter.

This type of A/D converter works in three steps. In the first step, the input switch is coupled to ground and the counter is preset to a number $N_O$. The integrator is also set to zero during this stage. In the second stage, the switch is coupled to the input signal, and the counter and integrator are released. The counter begins to count down towards zero and the integrator voltage grows at A, dependent on the input line voltage.

After the counter has reached zero, the control circuit switches the switch to the reference voltage and begins counting up from zero. The integrator voltage is now dependent on the reference voltage VR. When the integrator voltage reaches zero, the comparator output turns off the counter. The count accumulated in the counter at the end of this time interval is proportional to the analog input signal.

Another type of A/D converter is known as a successive approximation converter. One type of this converter employs a scheme known as charge redistribution and utilizes an array of capacitors or resistors or both, to provide ranges of values to define the level of an analog input signal. For example, a variety of capacitors are provided whose capacitance values are in a binary relationship. That is, if the capacitance of the lowest capacitor is C farads, capacitors having capacitance values of 2C, 4C, 8C, 16C, 32C, etc., are also provided. The greater the number of capacitance values, the more precise the conversion of analog to digital signals can be achieved.

To provide an A/D converter having 8-bit precision, at least 3 levels of capacitance, C, 2C, and 4C, are provided. In this manner, through an appropriate switching scheme, capacitance levels of C, 2C, 3C (C+2C), 4C, 5C (4C+C), 6C (4C+2C) and 7C (4C+2C+C) can be defined.

The linearity of such a capacitor value scheme depends upon the accuracy of the ratios of the capacitors to each other. If the capacitor ratios are not the desired integer ratios, non-linearity in the output of the A/D converter results.

It is desired for the output of an A/D converter to be substantially linear. In the prior art, particularly in switched capacitor A/D converters, converter linearity depends on the matching of resistors and capacitors. Such matching of capacitors and resistors adds to the expense of manufacturing such A/D converters.

Therefore, it is an object of the present invention to provide an A/D converter which provides a linear output without the need for precise matching of individual components.

It is another object of the present invention to provide an A/D converter in which the effect of mismatched components can be averaged out and substantially eliminated.

SUMMARY OF THE PRESENT INVENTION

A method and apparatus for removing the effects of mismatched components in an A/D converter is described. The present invention dynamically rearranges the capacitors of an A/D converter so that physical mismatch is averaged out.

In the preferred embodiment of the present invention, an array of equally-sized capacitors is coupled to a switching network. A successive approximation scheme is implemented in which the input signal is coupled through successive approximation register (SAR) switches to the capacitor array. Each switch is coupled to $2^{N-1}$ capacitors where N is the switch number. For example, in an 8-bit scheme, there are 3 switches with switch 1 coupled to one capacitor, switch coupled to two capacitors, and switch 3 coupled to four capacitors. In this manner, eight levels of capacitance values can be defined.

The present invention adds a scramble control code to control the switching array so that the physical capacitors themselves are coupled to different SAR switches at different times. This requires a scramble matrix of switches, which in the present invention requires $N \times 2N$ switches where N equals the number of bits of control code. In this manner, the effects of any variations in the capacitance ratios is averaged out and converted to noise which can be filtered out of the signal.

In the preferred embodiment of the present invention, the switching matrix is controlled by a scramble control code generated by simple digital counter. The counter counts continuously, resetting at the end of its count so that the switching matrix continuously cycles the capacitors between SAR switch group arrays. In one embodiment, the least significant bit of the counter controls that part of the switching matrix coupled to the most significant bit of the A/D converter.

By utilizing the switching scheme of the present invention, the converter converts the effect of component mismatching to broadband noise. Filtering of the converter signal can remove this broadband noise, providing a substantially linear A/D converter.

To conserve silicon area, a cascade-type A/D converter configuration may be employed with each stage in the cascade utilizing the scrambled switching scheme of the present invention. In other embodiments, only one or more stages of the cascade scheme utilize the switching scheme.

DETAILED DESCRIPTION OF THE PRESENT INVENTION

A method and apparatus for removing the effects of mismatched components in an A/D converter is described. In the following description, numerous specific details, such as number of switches, number of bits, etc., are described in order to provide a more thorough description of the present invention. It will be apparent, to one skilled in the art, that the present invention may be practiced without these specific details. In other instances, well known features have not been described in detail so as not to obscure the present invention.

PRIOR ART

An A/D converter having $2^N$ bits of precision requires N levels of capacitance values in binary sequence (1,2,4,8,etc.). Thus, an A/D converter having 8 bits of precision requires 3 capacitors of C, 2C and 4C capacitance, respectively.

One method of providing such an A/D converter in an integrated circuit is to form three capacitors with each succeeding capacitor having an increased area so that a 1:2:4 ratio of capacitance is achieved. However, in circuit processing, it is difficult to repeatedly achieve proper sizing of such capacitors. It has been found easier to provide an array of identically-sized capacitors and group these capacitors according to the desired capacitor ratio values. In the case of an 8-bit A/D converter, four capacitors of value C are coupled to one SAR switch, two capacitors of value C are coupled to a second SAR switch, and a single capacitor is coupled to a third SAR switch.

Figure 1:
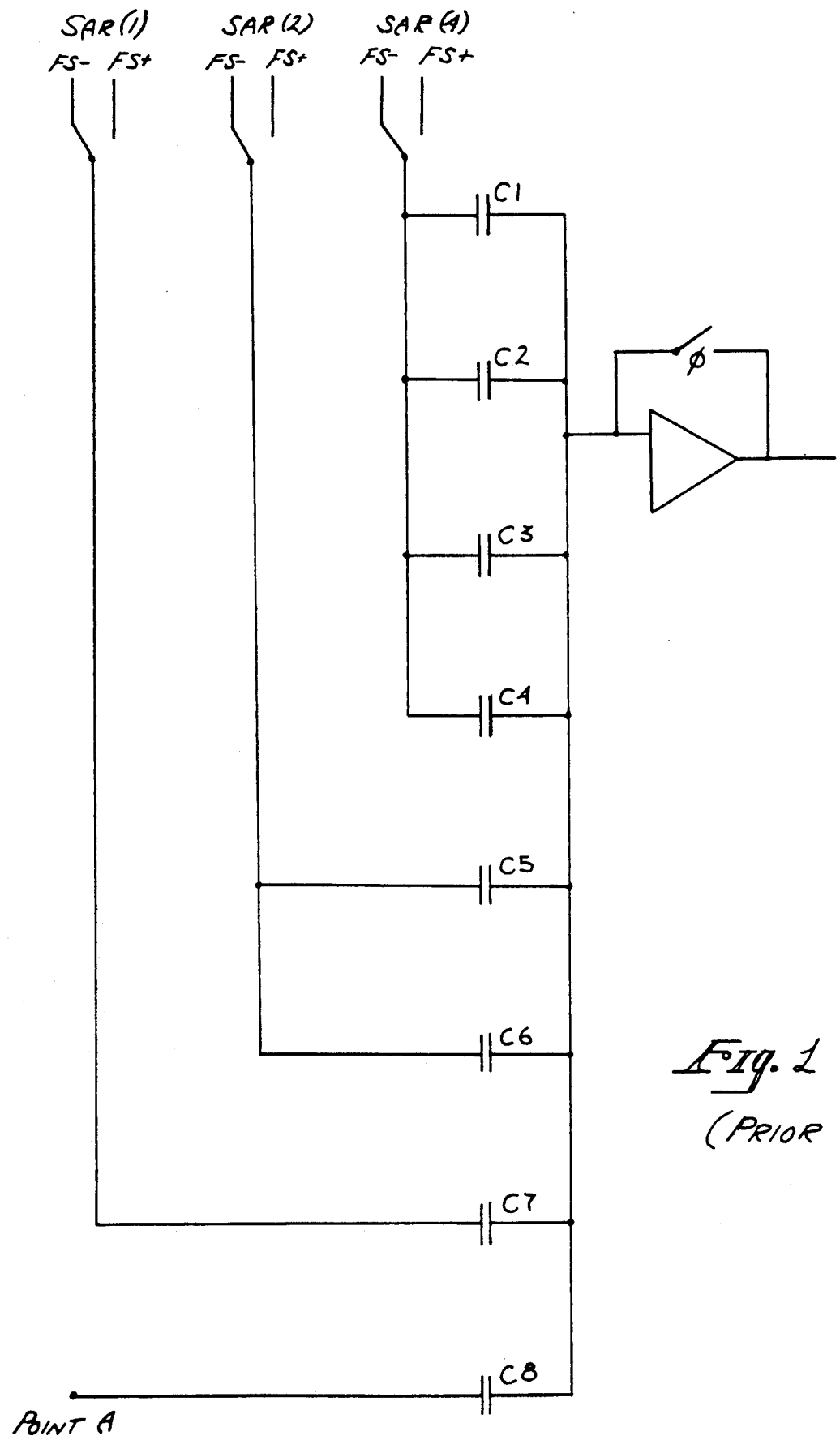
FIG. 1 is a circuit diagram illustrating a prior art A/D converter.

An example of one such prior art A/D converter is illustrated in FIG. 1. An array of equally-sized capacitors, C1 through C8, is provided with each capacitor having a capacitance of C. A successive approximation scheme is utilized having 3 SAR switches, SAR (1), SAR (2) and SAR (4). The SAR switches, SAR (1)--SAR (4) are switched between full-scale negative and full-scale positive values respectively. The SAR switches are controlled by output of successive approximation registers. A charge is established as an initial condition in the array in a manner well known in the prior art. The content of the registers are then set so that the output of the capacitor array approximates the value of the analog input signal. The digital value stored in the successive approximation registers at that time represents the digital conversion of the analog signal input. The SAR (1) switch is coupled to a single capacitor C7. The SAR (2) switch is coupled to 2 capacitors C5 and C6 and the SAR (4) switch is coupled to 4 capacitors, C1-C4. Point A typically is grounded, but could represent one output of another stage of a cascade-type A/D converter.

The output at node 15 of the capacitor array is coupled to an input of comparator 11. The output 12 of comparator 11 is coupled to the feedback loop through switch 14 to the input of the comparator.

The disadvantage of this prior art method, as shown in FIG. 1, occurs when one or more of the capacitors is mismatched. For example, if capacitor C4 is mismatched, when the more significant bit of output signal is coupled to the mismatched capacitor, the output value is incorrect because the capacitance for that bit is too large (or too small). The effects of mismatched capacitors are reduced for lower significant bits, but it is difficult to predict where mismatchees will occur. It is desired to provide a A/D converter in which the effects of mismatched capacitor values can be averaged out over time with a more linear response.

PRESENT INVENTION

The present invention provides a switching matrix to the capacitor array of a switched capacitor A/D converter. The switching matrix is controlled by a scramble code to rotate the individual capacitors through all SAR switch groups. To remove the effect of mismatched capacitors, the capacitors should be rotated in proportion to the relative ratio of the SAR groups. For example, if an SAR group has M capacitors out of a total array of N, any one capacitor should be in that SAR group M/N of the time and in the remaining groups the remainder of the time. This insures that the effects of mismatched capacitors will be averaged out evenly and completely through the whole group array.

For a capacitor array having N SAR groups, $N \times 2^N$ switches are required in the scramble switch matrix to provide adequate rotation of the capacitors. In an alternate embodiment of the present invention, several scrambled stages are cascaded together with the output of one scrambled stage coupled as an input to one switch of a second scrambled stage.

Figure 2:
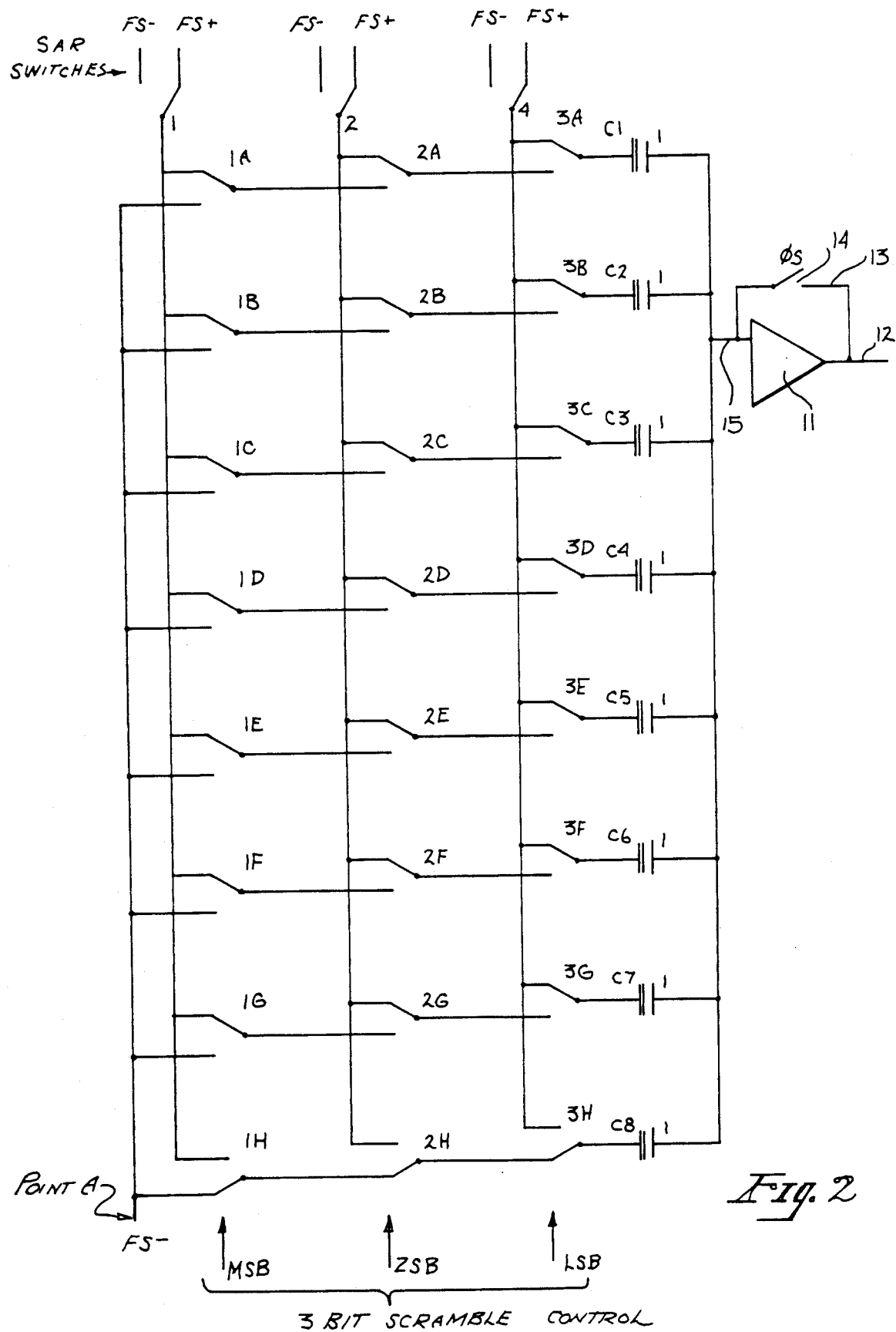
FIG. 2 is a circuit diagram illustrating an A/D converter of the present invention.

An example of the present invention is illustrated in FIG. 2. The example of FIG. 2 is for an A/D converter with three SAR groups. Switches 1A-1H through 3A-3H are coupled to one terminal of capacitors C1-C8 and to SAR switches SAR (1), SAR (2) and SAR (4), respectively. This switching matrix is controlled by a 3-bit scramble control code 10.

The scramble control code 10 is such that the least significant bit is coupled to the largest SAR switch group. The most significant bit is coupled to the smallest SAR switch group. In this case, the least significant bit is coupled to the SAR switch group having 4 capacitors. In the embodiment shown, the switches 1A-1H, 2A-2H and 3A-3H are in the position shown when a logical "0" is on the control line for the respective groups of switches. When a logical "1" is on the control line, the switch position is reversed.

The following table shows the capacitors which are coupled to each of the SAR switch groups for each value of the scramble control code 10.

TABLE 1

| | \multicolumn{8}{c}{Scramble Code 10} |
| --- | --- | --- | --- | --- | --- | --- | --- | --- |
| | 000 | 001 | 010 | 011 | 100 | 101 | 110 | 111 |
| SAR (1) | C7 | C3 | C5 | C1 | C8 | C4 | C6 | C2 |
| SAR (2) | C5-C6 | C1-C2 | C7-C8 | C3-C4 | C5-C6 | C1-C2 | C7-C8 | C3-C4 |
| SAR (4) | C1-C4 | C5-C8 | C1-C4 | C5-C8 | C1-C4 | C5-C8 | C1-C4 | C5-C8 |
| Point A | C8 | C4 | C6 | C2 | C7 | C3 | C5 | C1 |

Referring to SAR switch group 4, the number of capacitors M in this group is four. The total number of capacitors N is eight. Therefore, any one capacitor should be included in this switch group M/N or one-half of the time. As shown in Table 1, the SAR (4) group toggles back and forth between capacitors C1-C4, and capacitors C5-C8 so that each capacitor is in the SAR (4) switch group one-half of the time.

Similarly, SAR group 2 has two capacitors out of a total of eight, so that each capacitor should be in the SAR group one-fourth of the time. As shown in Table 1, each capacitor is in the SAR group two times out of a total of eight possibilities so that each capacitor is in this group one-fourth of the time. Similarly, each capacitor is in the SAR (1) group one-eighth of the time.

In the preferred embodiment of the present invention, the scramble control code is implemented with a digital counter. The counter counts to its highest value and resets to 0, and continuously repeats this process. The number of bits of the counter is equal to the number of bits of control code (e.g., 3 in FIG. 2). By providing an appropriate switching matrix, the proper ratio of capacitors in each SAR group is established. The least significant bit of the counter is coupled to the largest switch group in the preferred embodiment of the present invention, so that the maximum toggling of that group can occur. The counter is clocked once at the beginning of each conversion cycle.

Any suitable method of providing the scramble control code may be utilized without departing from the scope of the present invention. For example, in an alternative embodiment, a pseudo random-number generator could be utilized to provide the control code. A pseudo random-number generator is used instead of a true random number-generator so that the proper capacitor ratios may be achieved. That is, the switching of the capacitors from group to group is in the correct ratio as described above.

Figure 3:
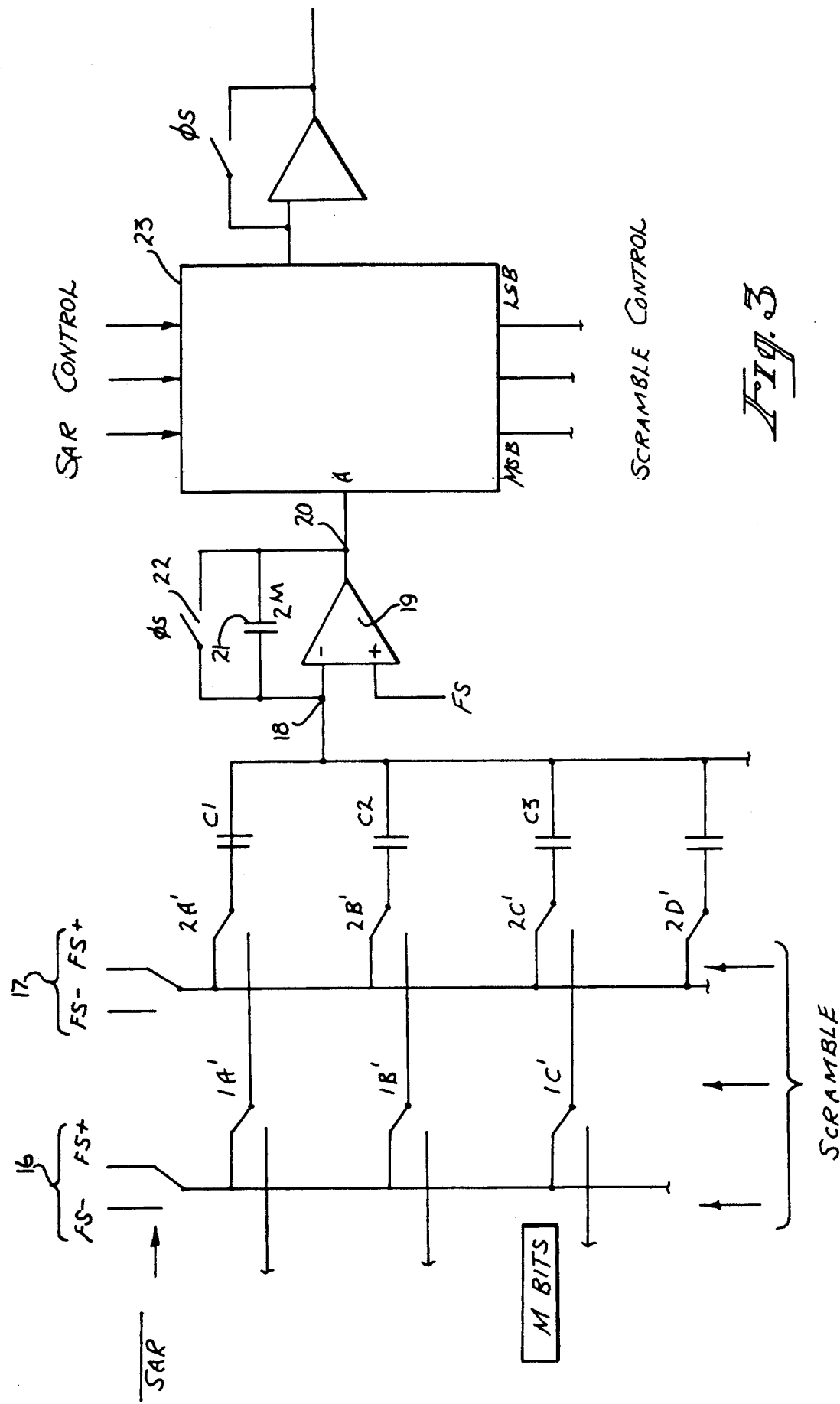
FIG. 3 is a circuit diagram illustrating an alternate embodiment of the present invention.
Figure 2:
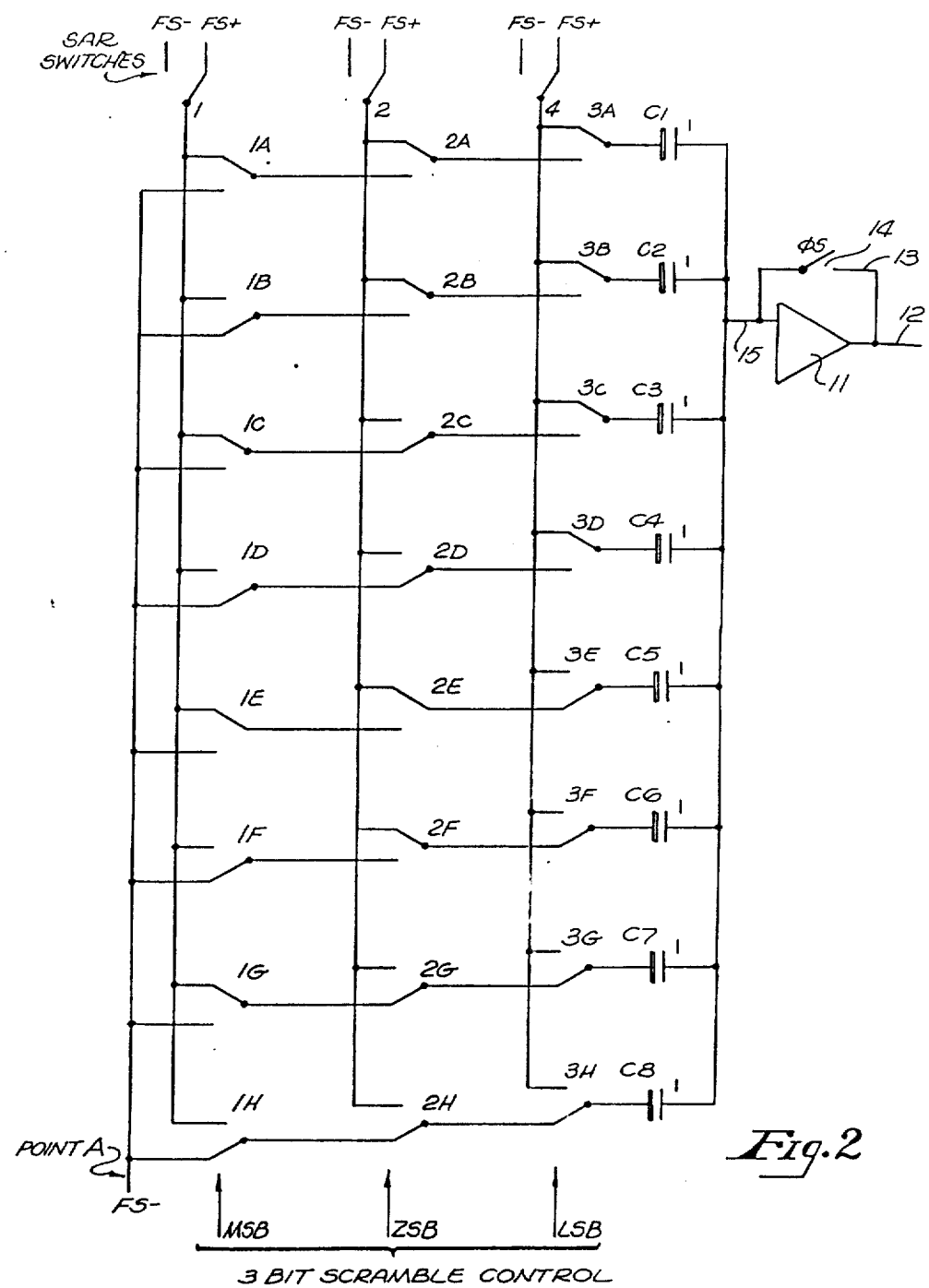

Referring now to FIG. 3, an example of a cascaded A/D converter is shown. In the example shown, a two SAR switch group arrangement is shown cascading into the A input of a three SAR switch group array such as the array of FIG. 2. Still referring to FIG. 3, the SAR switch 16 is coupled to a single capacitor at any one time, and SAR switch 17 is coupled to two of the capacitors C1'-C3'. A 2-bit scramble control code controls the switches 1A'-1D' and 2A'-2D' comprising the switching scramble matrix. The output of node 18 of the capacitor array is coupled to the inverting input of an operational amplifier 19 (in lieu of the comparator of FIG. 2). The output at node 20 of the op amp 19 is coupled in a feedback loop to the input note 18 through capacitor 21 and switch 22 in parallel. The output node 20 is also coupled to the A input of the SAR control array 3.

The A input of the control array is an analog signal which varies between plus and minus full scale. This provides an additional degree of resolution to the converter assembly. By cascading, silicon area can be saved. For example, if two 6-bit converters are cascaded together to form a 12-bit A/D converter, a total of 128 capacitors is required (a pair of $2^6$ arrays). If a single 12-bit converter is implemented to the twelve capacitors, 4,096 capacitors are required, adding to the silicon area of an IC implementing the present invention.

The function of the scramble matrix is to swap capacitor arrays to average out errors. If, for example, one capacitor is mismatched, (i.e., C4) when the scrambler LSB is "1" the MSB capacitor is too big and when the LSB is "0", the MSB capacitor is too small. This effect will average out through the switching array of the present invention. The decisions effecting the MSB are:

$$V_{IN} \stackrel{?}{>} \frac{C_1 + C_2 + C_3 + C_4}{C_{TOTAL}}$$

and $$V_{IN} \stackrel{?}{>} \frac{C_5 + C_6 + C_7 + C_8}{C_{TOTAL}}$$

If these are averaged together:

$$\frac{1}{2} \left( \frac{C_1 + C_2 + C_3 + C_4}{C_{TOTAL}} + \frac{C_5 + C_6 + C_7 + C_8}{C_{TOTAL}} \right) = \frac{1}{2} \frac{C_{TOTAL}}{C_{TOTAL}} = \frac{1}{2}$$

they cancel out, showing that any error introduced is averaged out by the scheme of the present invention.

The decisions made by the SAR on the next significant bit are:

$$V_{IN} \stackrel{?}{>} \frac{3}{4} \text{ and } V_{IN} > \frac{1}{4} FS$$

$$(0\ 0)\ V_{IN} \stackrel{?}{>} \frac{C_1 + C_2 + C_3 + C_4 + C_5 + C_6}{C_{TOTAL}} \stackrel{?}{>} \frac{C_5 + C_6}{C_{TOTAL}}$$

$$(0\ 1)\ V_{IN} \stackrel{?}{>} \frac{C_5 + C_6 + C_7 + C_8 + C_1 + C_2}{C_{TOTAL}} \stackrel{?}{>} \frac{C_1 + C_2}{C_{TOTAL}}$$

$$(1\ 0)\ V_{IN} \stackrel{?}{>} \frac{C_1 + C_2 + C_3 + C_4 + C_7 + C_8}{C_{TOTAL}} \stackrel{?}{>} \frac{C_7 + C_8}{C_{TOTAL}}$$

$$(1\ 1)\ V_{IN} \stackrel{?}{>} \frac{C_5 + C_6 + C_7 + C_8 + C_3 + C_4}{C_{TOTAL}} \stackrel{?}{>} \frac{C_3 + C_4}{C_{TOTAL}}$$

$$Avg = \frac{1}{4} \frac{3C_1 + 3C_2 + 3C_3 + 3C_4 + 3C_5 + 3C_6 + 3C_7 + 3C_8}{C_{TOTAL}} \stackrel{?}{>}$$

-continued $$\frac{1}{4} \frac{C_{TOTAL}}{C_{TOTAL}} \overset{?}{>} \frac{3}{4} \text{ exactly} \overset{?}{>} \frac{1}{4} \text{ exactly}$$

After one full cycle of the scrambler code, all capacitor errors are averaged out and the decision points will be exact. Since the MSB error is normally the worst, it should be changed most frequently, thus connecting it to the scrambler LSB.

By connecting a binary counter to the scramble inputs, capacitors errors will be removed if a DC level is being converted. What actually happens is that a fixed pattern noise is added to the encoded waveform whose lowest frequency component is $F_S/2^N$ where $F_S$ is sample rate. If $F_S$ is 10 Kilohertz, $N=9$, the frequency component is 19 hertz. This noise component has 0 mean value as shown previously, and this peak amplitude is the capacitor error $\times$ VFS. If the input is not DC, the noise will not be as predictable and can be approximated as white noise. Since the signal is already being contaminated with RMS noise of VLSB/12, if the cap ratio accuracy is less than $\frac{1}{2}$N, the additional noise caused by the scrambler will be dominated by the quantization noise.

This scheme works very well when small signals must be encoded with low distortion. Typically, an A/D will have its largest error at the midpoint (analog 0). If a small, 0 mean signal is to be encoded, the one-half scale error will cause a bad gain error if no scrambling is used. By scrambling, the average one-half scale decision level will be exact and there will be no gain error. Scrambling converts crossover distortion to noise.

The system bandwidth is much higher than the bandwidth of the signal being considered in the A/D converter in the present invention. Therefore, appropriate filtering can be implemented to remove the broadband noise resulting from the scrambling matrix of the present invention. Such filters are well known in the art and are typically used in many A/D converter applications.

Although the present invention has been described with respect to three SAR switch groups, it will be obvious that any number of switch groups can be utilized employing the present invention. Similarly, the size of the components of a cascaded A/D converter can be of any size with departing from the scope of the present invention as well. Further, although the present invention has been described in terms of capacitor arrays, it has equal application to resistor strings or other types of impedance devices.

Thus, an improved method for converting non-linearities in an A/D converter to noise has been described.

We claim:

1. A circuit comprising:
    a plurality of capacitors, each having a capacitance of approximately C;
    a first switch coupled to a first number x of said capacitors;
    a second switch coupled to a second number y of said capacitors;
    a switching matrix coupled to said plurality of capacitors and to said first and second switches for selectably coupling said plurality of capacitors to each of said first and second switches such that the time-averaged ratio of the amount of time one of said capacitors is coupled to said first switch compared to the amount of time said one of said capacitors is coupled to said second switch is approximately equal to x/y.

2. The circuit of claim 1 wherein said switching matrix is controlled by a control code.

3. The circuit of claim 2 wherein said control code is provided by a digital counter.

4. The circuit of claim 2 wherein said control code is provided by a pseudo random-number generator.

5. The circuit of claim 2 wherein said first and second switches are SAR switches.

6. The circuit of claim 5 wherein said switching matrix comprises a plurality of third switches coupled to said second switch and a plurality of fourth switches coupled to said first switch and said plurality of third switches.

7. The circuit of claim 6 wherein a least significant bit of said control code controls said plurality of fourth switches.

8. A method of reducing the effects of component mismatch in an analog to digital (A/D) converter having a plurality of capacitors each having a capacitance of approximately C, said plurality of capacitors coupled to a plurality of switches, said method comprising the steps of:
    defining at least first and second groups of said capacitors, said first group comprising x capacitors and said second group comprising y capacitors;
    selectively coupling a first of said switches to said first group and a second of said switches to said second group;
    switching each of said plurality of capacitors into said first group or said second group;
    controlling said switching of said capacitors such that the time-averaged ratio of the amount of time one of said capacitors is coupled to said first of said switches compared to the amount of time said one of said capacitors is coupled to said second of said switches is approximately equal to x/y.

9. The method of claim 8 wherein said step of switching each of said plurality of capacitors comprises coupling said capacitors through a switching matrix to said switches.

10. The method of claim 9 wherein said switching matrix is controlled by a control code.

11. The method of claim 10 wherein said control code is provided by a digital counter.

12. The method of claim 10 wherein said control code is provided by a pseudo random-number generator.

13. A circuit comprising:
    a plurality of impedance elements, each having an impedance which is approximately equal;
    a first switch coupled to a first number x of said elements;
    a second switch coupled to a second number y of said elements;
    a switching matrix coupled to said elements and to said first and second switches for selectably coupling said plurality of impedance elements to each of said first and second switches such that the time-averaged ratio of the amount of time one of said elements is coupled to said first switch compared to the amount of time said one of said elements is coupled to said second switch is approximately equal to x/y.

14. The circuit of claim 13 wherein said switching matrix is controlled by a control code.

15. The circuit of claim 14 wherein said control code is provided by a digital counter.

16. The circuit of claim 14 wherein said control code is provided by a pseudo-random number generator.

17. The circuit of claim 14 wherein said first and second switches are SAR switches.

18. The circuit of claim 17 wherein said switching matrix comprises a plurality of third switches coupled to said second switch and a plurality of fourth switches coupled to said first switch and said plurality of said third switches.

19. The circuit of claim 18 wherein a least significant bit of said control code controls said plurality of fourth switches.

20. The circuit of claim 19 wherein said plurality of elements comprises a plurality of capacitors.

21. A method of switching elements in a circuit having a plurality of impedance elements, each having an impedance which is approximately equal, coupled to a plurality of switches, said method comprising the steps of:

defining at least first and second groups of impedance elements, said first group comprising x impedance elements and said second group comprising y impedance elements;

selectively coupling a first of said switches to said first group and a second of said switches to said second group;

switching each of said plurality of impedance elements into said first group or said second group;

controlling said switching of said impedance elements, such that the time averaged ratio of the amount of time one of said impedance elements is coupled to said first of said switches compared to the amount of time said one of said impedance elements is coupled to said second of said switches is approximately equal to x/y.

22. The method of claim 21 wherein said step of switching each of said plurality of impedance elements comprises coupling said impedance elements through a switching matrix to said switches.

23. The method of claim 22 wherein said switching matrix is controlled by a control code.

24. The method of claim 23 wherein said control code is provided by a digital counter.

25. The method of claim 23 wherein said control code is provided by a pseudo random number generator.

26. A circuit comprising:
a plurality of impedance elements;
a plurality of switches;
a switching matrix coupled to said impedance elements and to said switches for selectively coupling said impedance elements to said switches such that each of said impedance elements is coupled to not more than one of said switches at any instant, but that each of said impedance elements is eventually coupled to each of said switches.

27. The circuit of claim 26 wherein said switching matrix is controlled by a control code.

28. The circuit of claim 27 wherein said control code is provided by a digital counter.

29. The circuit of claim 27 wherein said control code is provided by a pseudo random number generator.

30. The circuit of claim 27 wherein said first and second switches are SAR switches.

31. The circuit of claim 30 wherein said switching matrix comprises a plurality of third switches coupled to said second switch and a plurality of fourth switches coupled to said first switch and said plurality of fourth switches coupled to said first switch and said plurality of said third switches.

32. The circuit of claim 31 wherein a least significant bit of said control code controls said plurality of fourth switches.

33. The circuit of claim 32 wherein said plurality of elements comprises a plurality of capacitors.

34. The circuit of claim 26 wherein a first of said switches is coupled to a first number x of said impedance elements, and a second of said switches is coupled to a second number y of said impedance elements;

said impedance elements coupled to said switches such that the time-averaged ratio of the amount of time any one of said capacitors is coupled to said first switch compared to the amount of time said one of said capacitors is coupled to said second switch is equal to x/y.

* * * * *

UNITED STATES PATENT AND TRADEMARK OFFICE
CERTIFICATE OF CORRECTION

PATENT NO. : 5,006,854

DATED : April 9, 1991

INVENTOR(S) : White, et al

It is certified that error appears in the above-identified patent and that said Letters Patent is hereby corrected as shown below:

Fig. 2 should be deleted to be replaced with Fig. 2 as shown on the attached sheet.

Signed and Sealed this

Twentieth Day of October, 1992

Attest:

DOUGLAS B. COMER

*Attesting Officer*      *Acting Commissioner of Patents and Trademarks*